United States Patent [19]

Higuchi et al.

[11] Patent Number: 5,009,972
[45] Date of Patent: Apr. 23, 1991

[54] BLANK PLATES FOR FORMING MULTI-COLOR FLUORESCENT PLANES AND METHODS FOR FORMING MULTI-COLOR FLUORESCENT PLANES

[75] Inventors: Naoshige Higuchi, Tokyo; Toru Miyake, Funabashi, both of Japan

[73] Assignee: Dai Nippon Printing Co., Ltd., Tokyo, Japan

[21] Appl. No.: 330,842

[22] Filed: Mar. 28, 1989

[30] Foreign Application Priority Data

Mar. 29, 1988 [JP] Japan .................................. 63-75255
Mar. 29, 1988 [JP] Japan .................................. 63-75256
Mar. 29, 1988 [JP] Japan .................................. 63-75257

[51] Int. Cl.⁵ .................................................. G03F 9/00
[52] U.S. Cl. ............................................. 430/7; 430/4; 430/20; 430/321; 430/394
[58] Field of Search ................. 430/4, 7, 20, 321, 394

[56] References Cited
U.S. PATENT DOCUMENTS 4,828,947 5/1989 Sato et al. .............................. 430/7

Primary Examiner—Charles L. Bowers, Jr.
Assistant Examiner—Thomas R. Neville
Attorney, Agent, or Firm—Armstrong, Nikaido, Marmelstein, Kubovcik & Murray

[57] ABSTRACT

According to the present blank plate and method for forming multi-color fluorescent planes, a photosensitive layer is formed on one side of a substrate and exposed to light from the other side thereof. The step of exposure to light is carried out with a combination of a full-color pattern including light-transmitting segments in coincidence with every color pattern with a single-color mask including light-transmitting segments corresponding to each color pattern. After the full-color pattern has been formed on the substrate, the photosensitive layer containing a fluorophore is formed and, then, exposed to light from the side of the substrate opposite to the side having the photosensitive layer formed thereon through the single-color mask attached in place, followed by development. The above steps are repeated to form a multi-color fluorescent plane having the desired pattern. According to the present invention, since the arrangement of every color is established by the full-color mask, deviations of the total pitch and each color are determined exclusively depending upon the accuracy of the full-color mask. Hence, the allowable range of deviations of position alignment of the substrate with the single-color mask is so widened that such deviations of position alignment can be absorbed to make it easy to form multi-color fluorescent planes of extremely high accuracy.

11 Claims, 8 Drawing Sheets

UV
↓↓↓↓↓↓↓↓↓↓↓↓↓↓

PRIOR ART

BLANK PLATES FOR FORMING MULTI-COLOR FLUORESCENT PLANES AND METHODS FOR FORMING MULTI-COLOR FLUORESCENT PLANES

BACKGROUND OF THE INVENTION

The present invention relates to a blank plate for forming multi-color fluorescent planes and a method for forming multi-color fluorescent planes and, more particularly, to a blank plate for forming multi-color fluorescent planes for plasma display panels (hereinafter PDPs for short), etc. and a method for forming such multi-color fluorescent planes.

Conventionally, the direct current (DC) and alternate current (AC) types of PDPs have been known in the art. FIG. 8 illustrates the DC type of PDP which includes flat front and back plates 51 and 52 arranged opposite and parallel to each other, both being formed of glass. The back plate 52 is fixedly provided on its front side with a cell barrier 53 perpendicular thereto to define a cell 54, and the front and back plates 51 and 52 are spaced away from each other at a suitable interval by that cell barrier 53. The front plate 51 is provided on its back side with an anode 55, and the back plate 52 is provided on its front side with a cathode 56 perpendicular to said anode 55. On both sides of the anode 55 there are formed adjacent fluorescent planes 57.

In the above conventional DC type of PDP, an electric field is applied between the anode 55 and the cathode 56 to give rise to discharge in the individual cells 54 defined by the front and back plates 51 and 52 and the cell barrier 53. Ultraviolet rays generated by such a discharge then causes the fluorescent planes 57 to fluoresce, allowing a viewer 58 to make visual observation of the light trasmitting through the front plate 51.

Turning now to FIG. 9, there is shown the conventional AC type of PDP, which includes flat front and back plates 61 and 62 of glass arranged in opposition and parallel to each other, and in which the back plate 62 is fixedly provided on its front side with a cell barrier 63 perpendicular thereto to define a cell and the front and back plates 61 and 62 are spaced away from each other at a suitable interval by that cell barrier 63. The back plate 62 is provided on its front side with two electrodes 64 and 65 perpendicular to each other through a dielectric layer 66 with additional provision of a conductive layer 67 and a protective layer 68. The front plate 61 is provided on its back side with a fluorescent plane 69.

In the above conventional AC type of PDP, an alternate voltage is applied between the two electrodes 64 and 65, thereby giving rise to discharge in the individual cells defined by the front and back plates 61 and 62 and the cell barrier 63. Ultraviolet rays generated by such a discharge then cause the fluorescent plane to fluoresce, permitting a viewer 70 to make visual observation of the light transmitting through the front plate 61.

In some cases, the DC type of PDPs may include a mask 59 for preventing the reflection of external light, which comprises a light-shielding portion, so as to avoid the reflection of external light, as illustrated in FIG. 10. It is noted that, in FIG. 10, parts similar to those shown in FIG. 8 are shown by like reference numerals.

The fluorescent planes of the DC or AC type of PDPs of such structures are formed by coating a fluorophore-containing photosensitive slurry on the back sides of the front plates and, then, exposing it to light with the use of a photomask corresponding to a fluorescent plane pattern, followed by development and firing.

More specifically, an anode 72 is formed on one side of a transparent substrate 71 formed of glass, etc., as illustrated in FIG. 11(a). The anode 72 may be defined by a transparent electrode. However, when a panel is of increased size or is used for TV displays driven at high speeds, a gold (Au) paste is usually screen-printed and fired on the substrate to form an anode. This is because the transparent electrode has an increased resistance value. Then, a slurry liquid 73 containing a fluorophore of a given color is coated on the anode 72, as illustrated in FIG. 11(b). Thereafter, a photomask 74 is disposed on the side of the substrate 71 opposite to the side having the fluorophore-containing slurry liquid 73 coated thereon, as illustrated in FIG. 11(c), followed by exposure to given light, e.g., ultraviolet light. Subsequent development gives fluorescent planes on both sides of the anode 72, as illustrated in FIG. 11(d).

The slurry coat is thus exposed to light from the side opposite to the anode 72 through the substrate 71 for the following reason. In short, when it is to be exposed to light from the side having the anode 72 formed thereon, the photomask having its portion corresponding to the electrode shielded against light is located on the fluorophore slurry liquid 73 of FIG. 11(b). In this case, if there is only a slight deviation of the position of the photomask, the fluorescent planes then become asymmetric with respect to the anode 72. Further, the fluorescent planes may deteriorate or malfunction, since they are positioned such that they cover the anode 72. According to the above process, on the other hand, no fluorescent plane is formed on the anode 72, since the anode 72 itself functions as a mask.

It is appreciated that mixtures containing, e.g., a fluorophore, polyvinyl alcohol (PVA) and a diazonium salt may be used as the photosensitive slurry liquid, optionally with antifoamers and surface active agents.

In full-color panels, fluorophores emitting three fluorescences of red, green and blue have to be selectively arranged. The steps of coating of a photosensitive slurry containing each emissive fluorophore, exposure to light with the use of a photomask corresponding to the predetermined arrangement and development are repeated by the number corresponding to the kinds (usually three) of fluorophores to form multi-color fluorescent planes. Used in this case is a process wherein provided are photomasks including light-transmitting segments corresponding to the respective color arrangements, which are equal in number to the emissive colors, and the light-transmitting segments are regulated such that they are in agreement with the respective color arrangements for the purpose of exposure to light.

In such a conventional process for forming multi-color fluorescent planes, however, it is required that the photomasks corresponding in number to the emissive colors be in precise coincidence with the respective color arrangements. In the actual steps of forming multi-color fluorescent planes, it is still very difficult to bring the photomasks in complete coincidence with the respective color arrangements with high accuracy. For that reason, the following problems arise:

(1) First of all, when a plurality of photomasks are used for each emissive color, only a slight deviation of the total pitch, etc. of the mask patterns gives rise to a variation in the relative positions of the fluorescent plane corresponding to each cell and the cell structure, thus posing such problems that any precise colors of the panel are not obtained, or uneven colors are emitted over the entire surface of the panel.

(2) Secondly, extreme difficulty is encountered in achieving the position alignment of the photomasks with the front plate. In order to bring the photomasks corresponding to the emissive colors in coincidence with the respective color arrangements, the photomasks or the front plate are moved by a moving device such as a stepping motor, while monitored through a camera. Since inherent limitations are placed upon the accuracy of the camera or moving device, however, it is indeed impossible to accurately set its X, Y and $\theta$ (a tilt) directions. As is the case with the above (1), a slight deviation of position alignment makes it impossible to obtain any faithful reproducibility of colors and any uniformity of colors emitted over the entire surface of the panel.

(3) Repeated precise position alignment of the full-surface plate with the photomasks results in complicated steps and a lowering of productivity.

(4) The plasma display panels are expected to be used with substrates of considerable diagonal sizes from 9 to 14 inches for office automation terminals to 20 to 80 inches for flat TVs. However, to make photomasks corresponding to emissive colors with more precise total dimensions, pitches, etc. offer a problem difficult to solve in view of the thermal expansion of the material used and setting-up of working atmosphere. For instance, if soda glass is used as the material for a substrate of a diagonal size of 40 inches, there is then an about 9-$\mu$m diagonal deviation as a whole, given a temperature change of 1° C., since the soda glass has a coefficient of thermal expansion of $92 \times 10^{-7}/°C$. Hence, stringent temperature control is needed.

SUMMARY OF THE INVENTION

The present invention has been accomplished to solve the foregoing problems, and has for its object the provision of a method for forming multi-color fluorescent planes, which makes it possible to form multi-color fluorescent planes used for plasma display panels with fair accuracy and facility.

According to the present method for forming multi-color fluorescent planes, the above object is achieved by exposing a photosensitive layer to light from the side of a substrate opposite to the side having the photosensitive layer formed thereon with a combination of a full-color pattern including light-transmitting segments corresponding to every color pattern with a single-color pattern having light-transmitting segments corresponding to each color pattern.

According to the above method, a multi-color fluorescent plane having the desired pattern can be formed by repeating the steps of forming a full-color pattern on a substrate, then forming a fluorophore-containing photosensitive layer on the substrate, and exposing the photosensitive layer to light from the side of the substrate opposite to the side having the photosensitive layer formed thereon through a single-color mask, followed by development.

According to the present invention, since the arrangement of every color is established by the full-color mask, deviations of the total pitch and each color are determined exclusively depending upon the accuracy of the full-color mask. Hence, the allowable range of deviations of position alignment of the substrate with the single-color mask is so widened that such deviations can be absorbed to make it easy to form multi-color fluorescent planes of high accuracy.

DESCRIPTION OF THE PREFERRED EMBODIMENTS

Embodiments of the present invention will now be explained with reference to the accompanying drawings.

FIG. 1(a)-1(f) is a view illustrative of the steps of the first embodiment of the method for forming multi-color fluorescent planes according to the present invention. It is understood that electrodes are omitted from FIG. 1(a)-1(f).

Figure 1A:
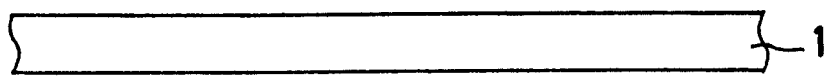
FIG. 1(a)-1(f) is a sectional view for illustrating the method for forming multi-color fluorescent planes according to the first embodiment of the present invention.

Referring first to FIG. 1(a), a substrate 1 is formed of a transparent material. As the material for the substrate 1, use may be made of glass, plastics and transparent ceramics. Especially when used for PDPs, however, preference is generally given to glass, since it is required for the substrate to excel in both transparency and heat resistance, not to release impure gases, to be of satisfactory flatness and free the transmitted image of distortions. While the glass includes soda glass, lead glass, borosilicate glass and the like, use is usually made of soda glass in view of cost.

In order to obtain a uniform coating of a fluorophore slurry liquid, the substrate 1 is first washed with a neutral detergent, an alkaline detergent or an aqueous solution in pure water of a mixed liquid of sulfuric acid with potassium nitrate at a ratio of 2:1, and finally with pure water.

It is here noted that during washing, ultrasonic washing may be applied to increase the effect of washing. After washing, the substrate 1 may be further treated on its surface to improve the affinity with respect to the fluorophore slurry liquid to be coated in the post-steps. To this end, the substrate 1 may be coated with a highly hydrophilic substance or discharge-treated, whereby it is possible to reduce coating variations of the slurry liquid.

Figure 1B:
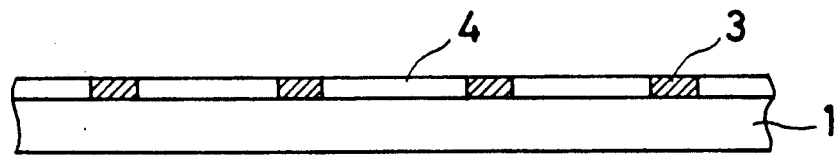
Figure 1C:
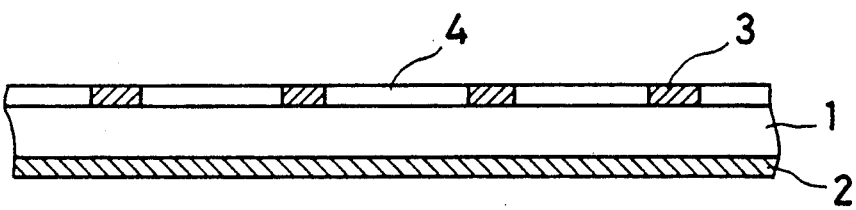
Figure 2:
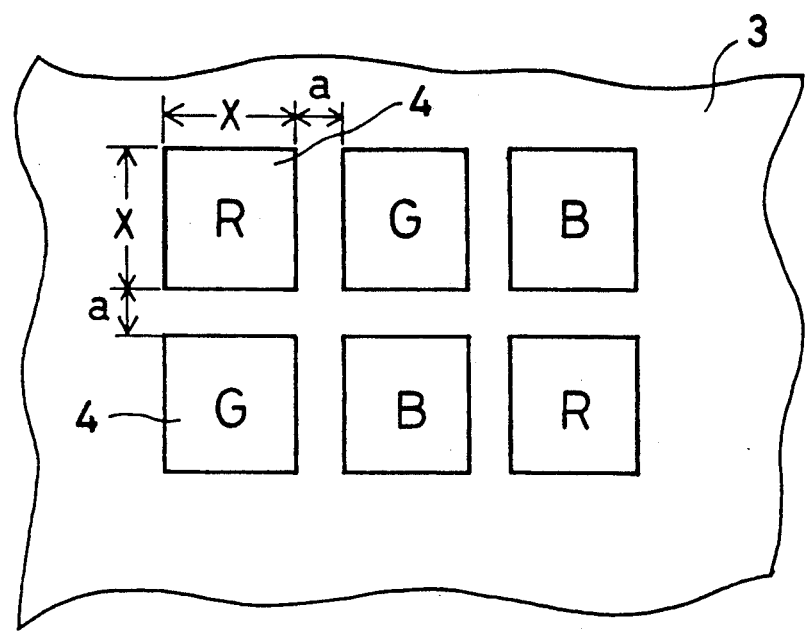
FIG. 2 is a plan view showing one example of the full-color mask.

After washing, the substrate 1 is dried to form a blank plate for forming multi-color fluoresent planes (hereinafter referred simply to as the blank plate), as shown in FIG. 1(b). The blank plate according to the present invention includes the substrate 1 and a mask 3 having a full-color pattern (hereinafter called the full-color mask) provided thereon. As illustrated in FIG. 2, the full-color mask 3 has light-transmitting segments 4 in agreement with every color pattern formed on the substrate 1. It is noted that in FIG. 2, R, G and B stand for pattern arrangements of red, green and blue, respectively, and each light-transmitting portion 4, corresponding to the shape of the fluorescent plane of each cell, is in the form of a square having a side of x in length and is spaced away from the adjacent light-transmitting portion 4 at an interval a.

The full-color mask 3 may be formed in various manners by vapor-depositing a chromium film on a glass substrate and etching a given pattern by resist working to form a chromium mask or forming an emulsion mask on a glass substrate. Alternately, a given black pattern may be formed on a transparent film such as a polyethylene terephthalate (PET) film by printing or photo-processing. Further, an aperture of a given pattern may be formed in a light-absorbing film, sheet or glass. In view of accuracy, dimensional stability, heat resistance and service life, however, preference is given to the use of a mask using glass as the substrate.

Mounting of the full-color mask 3 on the substrate 1 may be achieved with a bonding agent, or attaching a peripheral edge of the full-color mask 3 to the substrate 1 with the use of an adhesive tape resistive to the drying temperature applied or alternatively mechanical clamping of only the peripheral edge of the full-color mask 3 into the substrate 1. In consideration of the fact that the full-color mask 3 is to be removed after the formation of the multi-color fluorescent planes, however, it is easy and hence preferable to either attach only the peripheral edge of the full-color mask 3 to the substrate 1 with the use of a heat-resistant adhesive tape or fix only the peripheral edge of the full-color mask 3 to the substrate by mechanical clamping. It is here to be understood that care should be taken of so as to prevent the disengagement or dislocation of the full-color mask from the substrate 1 during the process.

After the blank plate has been formed as mentioned above, a fluorophore slurry liquid 2 is coated on the side of the substrate 1 that is in opposition to its side having the full-color mask 3 mounted thereon.

The slurry liquid 2 comprises a fluorophore, a photosensitizier, an additive and a solvent.

As red fluorophores use may be made of $Y_2O_3$:Eu, $Y_2SiO_5$:Eu, $Y_3Al_5O_{12}$:Eu, $Zn_3(PO_4)_2$:Mn, $YBO_3$:Eu, $(Y, Gd)BO_3$:Eu, $GdBO_3$:Eu, $ScBO_3$:Eu, $LuBO_3$:Eu and the like. Blue fluorophores may include $Y_2SiO_5$:Ce, $CaWO_4$:Pb, $BaMgAl_{14}O_{23}$:Eu and so on, and green fluorophores $Zn_2SiO_4$:Mn, $BaAl_{12}O_{19}$:Mn, $SrAl_{13}O_{19}$:Mn, $CaAl_{12}O_{19}$:Mn, $YBO_3$:Tb, $BaMgAl_{14}O_{23}$:Mn, $LuBO_3$:Tb, $GdBO_3$:Tb, $ScBO_3$:Tb, $Sr_6Si_3O_8C_{14}$:Eu and so on.

It is noted that the fluorophore may be treated on its surface with silane, Volan and the like so as to improve its adhesion with the substrate 1. Instead of applying such a surface treatment, water glass, etc. may be added as a binder. It is further noted that because of its white color, the fluorophore reflects external light. In order to reduce the reflection of external light by the fluorophore per se and improve contrast, it may be desired to add a red pigment to red fluorophores, a green pigment to green fluorophores and a blue pigment to blue fluorophores.

The photosensitizers used are of the negative and positive types. Use is generally made of the negative type of photosensitizer advantageous for the formation of thick films. Known to this end are, for instance, PVA-diazonium salts, PVA-ammonium dichromate (ADC), PVA-stilbazolquinone (SBQ) and so on.

The additives serve to uniformly disperse the fluorophore, and added to this end are surface active agents, hydrophilic polymers and so on.

As the solvent water is used, since the slurry liquid is of an aqueous system. An alcohol may also be used alone or in combination with other solvent soluble in water.

The foregoing components are mixed and milled together to disperse the fluorophore uniformly throughout a photosensitizing liquid by suitable means such as ball milling, sand milling or three-roll milling.

It is here to be noted that since there may be reductions in brightness and emission efficiency due to the presence of additives other than the fluorophores, attention should be paid to the amounts of the additives to be applied.

Although the concentration of the fluorophore in the slurry liquid is generally in a range of 10 to 60% by weight and the concentration of the photosensitizer in a range of 0.5 to 8% by weight, it goes without saying that the proportion of these components may be appropriately adjusted depending upon the suitability of the coating procedures applied, the resolvability of patterns, the thickness of the fluorescent pattern to be obtained and like factors.

The fluorophore slurry liquid obtained as mentioned above may be coated on the substrate 1 by suitable methods such as a method using a blade coater, a method using a spray, a screen printing method, a rotary coating method using a spinner, a sedimentation method or a dipping method wherein the fluorophore slurry liquid is applied to the substrate 1 kept upright. In any coating methods, results considered optimum in view of emission properties and the resolvability of patterns are obtained when coating is carried out in such a way that the coated film has a thickness of 5 to 20 $\mu$m, as measured after drying. It is to be understood that in the case of a transmission type of panel, high accuracy and uniformity are needed of the thickness of the coated layer, since there is a reduction in brightness when the thickness of the fluorescent plane departs from the optimum value.

After the fluorophore slurry liquid is applied on the substrate 1, the substrate 1 is dried by using air-drying and/or low-temperature drying to remove the solvent from the fluorophore slurry liquid. Since some fluorophore slurry liquids are cured by heat, however, it is desired that drying be carried out at a temperature of 50° C. or lower.

Figure 1D:
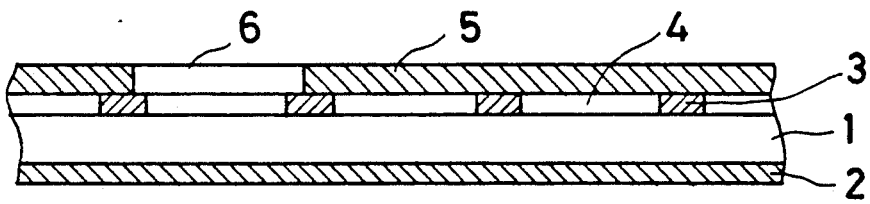

After drying the fluorophore slurry liquid, a single-color mask 5 is mounted on the full-color mask 3, as shown in FIG. 1(d), and a light-transmitting segment 6 of the single-color mask 5 is in alignment with the position of the first color of the full-color mask 3.

Figure 3:
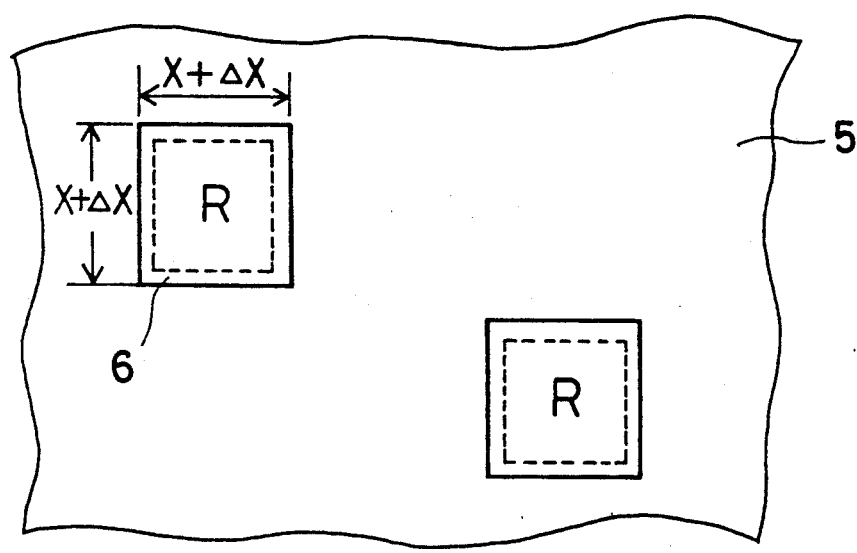
FIG. 3 is a plan view showing one example of the single-color mask.

As illustrated in FIG. 3, the single-color mask 5 has a light-transmitting segment 6 corresponding to the position of a fluorescent plane of the first color, e.g., red.

The light-transmitting portion 6 is defined by enlarging the periphery of the fluorescent cell plane of the first color, assuming on a square having a side of X+ΔX in length. The size of the light-transmitting segment 6 of the single-color mask 5 should be such that it completely surrounds the corresponding light-transmitting segment 4 of the full-color mask 3, but does not interfere with the adjacent light-transmitting segment 4. In other words, the condition of 0<Δx<a should be satisfied in the embodiment illustrated in FIGS. 2 and 3. More specifically, Δx of about a/2 should preferably be applied so as to make the position alignment of the single-color mask 5 easy.

The single-color masks 5 of various colors may be formed by similar methods as mentioned in connection with the full-color mask 3. The single-color mask 5 may also be mounted in place by similar methods as used for mounting of the full-color mask 3 or vacuum adhesion. However, the single-color mask 5 need not be mounted in place with a force stronger than required for mounting of the full-color mask 3, since it is to be removed after exposure to light.

Figure 1E:
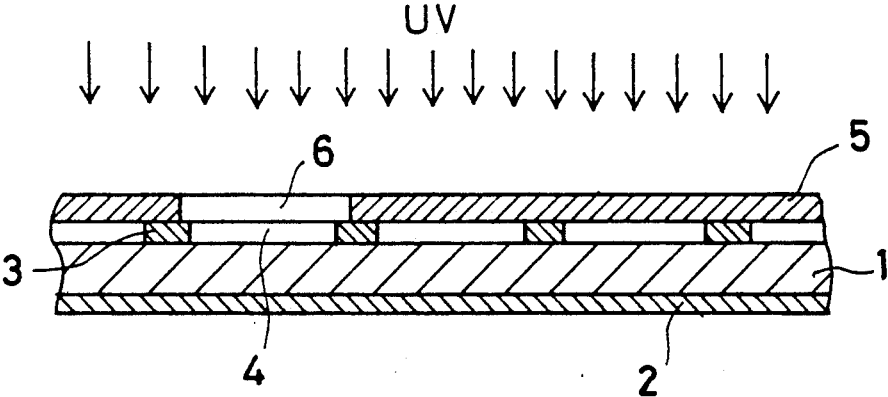

After mounting of the single-color mask 5, the panel is irradiated with and exposed to given light from the side of the single-color mask 5, as illustrated in FIG. 1(e). When ultraviolet rays (UV) are used for that purpose, a mercury-xenon lamp or a high-pressure mercury lamp may be used as the light source. It is then preferred that parallel light rays are used to reduce an influence of scattered light and make an emitted color uniform over the entire surface of the panel. For that purpose, ultraviolets rays may be emitted from an irradiation lamp and, then, passed through a plastic lens, etc. to obtain parallel light rays.

Since the negative type of photosensitizer is used in the illustrated embodiment, only the portions exposed to UV are cured.

After irradiation of or exposure to light, a fluorescent plane of the color corresponding to the single-color mask 5 is formed by development. As a matter of course, the shape of the formed fluorescent plane is a square corresponding to the full-color mask 4 and having a side of X in length. It may also be possible to adjust the thickness of the fluorescent plane remaining on the substrate 1 by suitable regulation of the amount of the light to be irradiated.

Development may be carried out by spraying of a developer, allowing a developer to flow down along the exposed substrate kept upright, immersing the exposed substrate in a developer or brushing off an unexposed fluorophore.

Cold or hot water may be used as the developer. In some case, resolvability may be improved by adding some amounts of surface active agents to cold or hot water.

Referring now to an example where development is carried out by spraying warm water of 40° C., the substrate 1 is sprayed on its entire plane with the water, and is then allowed to stand as such for tens seconds to infiltrate the entire fluorescent plane with the developer. Removal of the fluorophore from an unexposed region by further spraying gives a fluorophore pattern of the first color.

Upon the completion of development, the developer is removed by drying. Drying is carried out by heating at 100° to 150° C. for about 30 minutes, whereby the developer is removed with curing of the fluorophore.

Figure 1F:
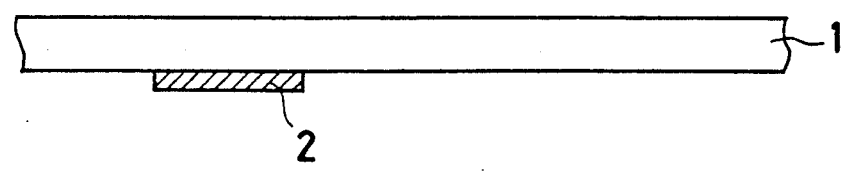

With the drying step completed, the fluorescent plane of the first color is formed, as illustrated in FIG. 1(f).

It is preferred at this time that inspection is made of whether or not the fluorophore of the first color is formed in the desired pattern. If the fluorophore is deposited onto regions other than the given pattern region, it is then possible to remove deposits by laser or mechanical means, since only the fluorophore pattern of the first color is formed. Unless the fluorophore is deposited onto the given region, on the other hand, the region is again subjected to coating of the flourophore surry, irradiation and development, whereby the desired fluorophore pattern is easily formed.

It is appreciated in the above steps that the single-color mask 5 may be mounted in place by the time of inspection in consideration of the inspection and correction, but it may be removed just after the irradiation step, because the pattern alignment of the single-color mask 5 with the full-color mask 3 is easily achieved in the present invention.

Fluorescent planes of the second and third colors are formed by repeating the above steps. More specifically, the fluorescent planes of the second and subsequent colors are formed by the repetition of coating of the fluorophore slurry liquid, irradiation, development and drying, while the single-color masks 5 of the corresponding colors are mounted in place.

It is appreciated that when the fluorescent planes of three colors are identical in the pattern position, one single-color mask may be used in varied positions.

After the fluorescent planes of the desired colors have been formed through the above steps, firing is carried out. The step for the firing is carried out by heating at 450° C. for about 10 minutes to avoid the deterioration of the fluorophores, since the object of that step is to remove organic components such as a binder which may otherwise interfere with discharge. Thus, it is obvious that the binder used with the fluorophore slurry liquid is required to be of the type that can be removed at a temperature lower than the temperature at which the fluorophores may deteriorate.

Attention should be paid to handling after firing because of a lowering of the adhesion between the substrate 1 and the fluorophores. For delivery, the products should further be packaged in a clean state to avoid their contamination with foreign matters such as dust.

It is noted that when it is intended to deliver the panel products prior to firing, it is desired that they are packaged with dry nitrogen in a clean state. More desirously, they are packaged in a rack to keep their fluorescent planes intact.

After firing, the opposite plates are brought in position alignment with each other for assembling, and the interior of the panel is evacuated and, then, filled with a given gas.

Figure 4A:
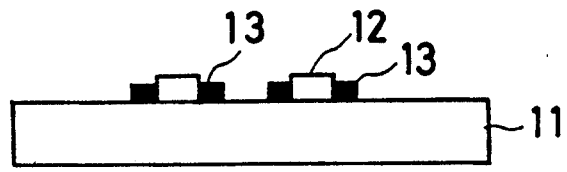
FIG. 4(a)-4(e) is a sectional view for illustrating schematically the steps of assembling the DC type of PDP.
Figure 4B:
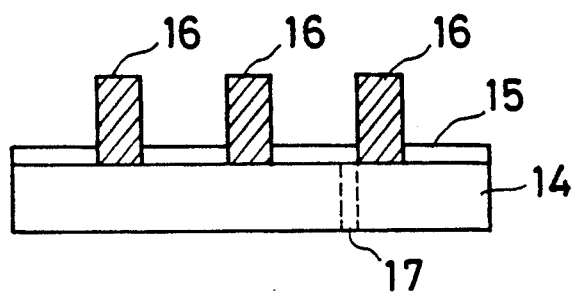
Figure 4C:
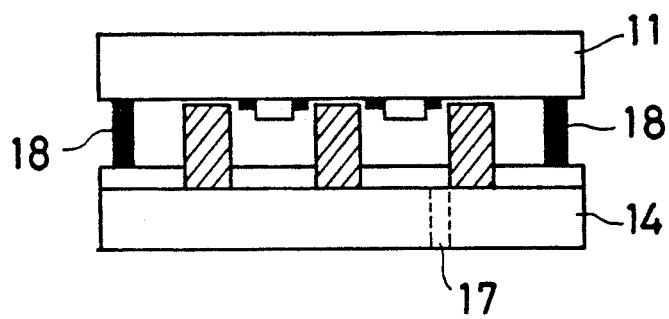

That step is illustrated in FIG. 4(a)–4(e) wherein (a) and (b) stand for a front plate and a back plate, respectively. The front plate includes a transparent substrate 11 provided with an anode 12 and a fluorescent plane 13 of a given color. For instance, the anode 12 may be formed by screen printing of an Au paste, followed by firing, and the fluorescent plane 13 is formed through the above steps. The back plate includes a substrate 14 provided with a cathode 15 and a cell barrier 16. For instance, the cathode 15 may be formed by screen printing of a nickel (Ni) paste, followed by firing and the cell barrier 16 by screen-printing a glass paste about ten times, followed by firing. The substrate 14 forming the back plate is further provided with a through-hole 16 in a given position. Such front and back plates are brought in position alignment with each other and assembled together, as shown in FIG. 4(c). For assembling, the front and back plates are precoated on their peripheries with a low-melting glass paste 18 by screen printing or a dispenser. After drying, the low-melting glass is melted by heating at about 450° C. for about 10 minutes to seal both the plates together. It is then required to achieve a uniform coating of the low-melting glass so as to assure vacuum resistance. It is further required that during heating, the front and back plates be clipped or otherwise fixed together to avoid their dislocation during sealing.

Figure 4D:
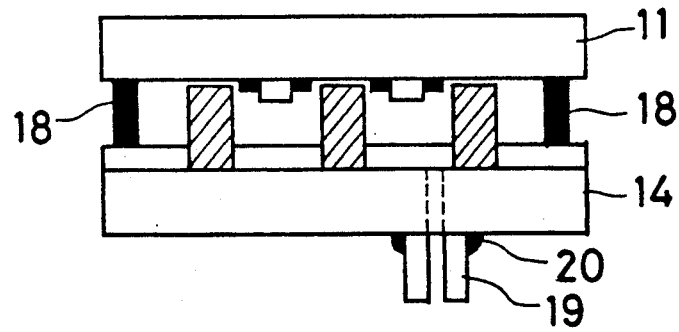

As illustrated in FIG. 4(d), a chip tube 19 is thereafter bonded to the position of the through-hole 17 by a low-melting glass paste 20 to degasify the interior of the panel, followed by filling of a given gas, e.g., a mixed gas of He and Xe. In general, the pressure of the gas to be filled is in a range of 200 to 500 Torr.

Figure 4E:
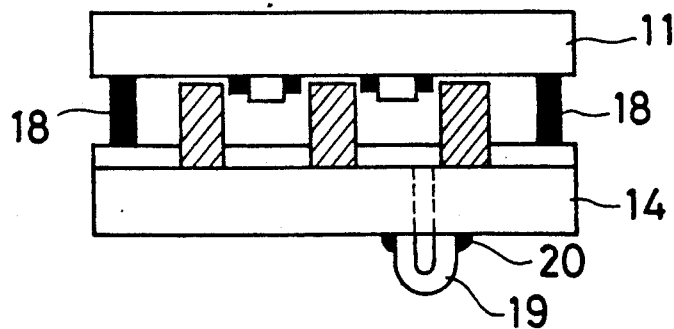

After filling of the given gas in this manner, the glass tube is heated for sealing, as shown in FIG. 4(e). It is appreciated that, if required, a better electrode may be provided or mercury (Hg) may be diffused throughout the panel so as to prevent the cathode from being sputtered by discharge.

Desirously, the above steps should be carried out in a clean room. The reason is that since the plasma display panel is formed by fine processing, it is required to prevent its contamination with dust, etc.

In the embodiment described and illustrated, the fluorophore are coated by the so-called slurry method, but it is noted that an optical tackifying technique may be used, as known to form the fluorescent planes of CRTs. According to the optical tackifying technique, a powdery fluorophore is deposited onto a photosensitive tackifier capable of producing tackiness upon exposed to ultraviolet rays to form a fluorescent plane, as carried out in the following steps. The photosensitive tackifier is first coated on a substrate. After drying, the coating is exposed to light with a mask having a given pattern, followed by the deposition of the first fluorophore powders of a given color, and excessive fluorophore powders are then collected to form a first fluorescent plane. Next, the coating is exposed to light with a mask having a given pattern for the deposition of a fluorophore of the second color, and excessive fluorophore powders are removed to form a fluorescent plane of the second color. By repeating the above steps, it is possible to obtain a multi-color fluoresent plane having the desired pattern. It is appreciated that as the photosensitive tackifier, use is made of a material composed mainly of a diazonium salt and zinc chloride, e.g., a material consisting of 3% by weight of P chloride-diazoniline zinc chloride, 0.6% by weight of propylene glycol alginate, 0.3% by weight of ethylene glycol, 0.005% by weight of a surface active agent and 0.007 % by weight of ammonium dichromate with the balance being water.

Although the PDP having a dotted pattern in which square cells are arranged in the form of a matrix has been explained in the above embodiment, the present invention is not limited thereto and may, of course, be applicable to fluorescent planes in the matrix or striped form having various patterns. It also goes without saying that the present invention is generally applicable to the formation of multi-color fluorescent planes of PDPs, whether the AC type or the DC type.

In the above embodiment, coating of the fluorophore slurry liquid is carried out after the blank plate has been formed. However, the full-color mask may be applied to form the blank plate after coating of the fluorophore slurry liquid.

The second embodiment of the present invention will now be explained.

In the first embodiment as mentioned above, the blank plate is constructed by mounting and fixing the full-color mask 3 on the substrate 1. However, the blank plate may be constructed by forming the full-color pattern directly on one side of the substrate. FIGS. 5(a)-5(d) illustrate the steps of the process for forming a multi-color fluorescent plane with such a blank plate constructed by forming the full-color pattern directly on the substrate.

Figure 5A:
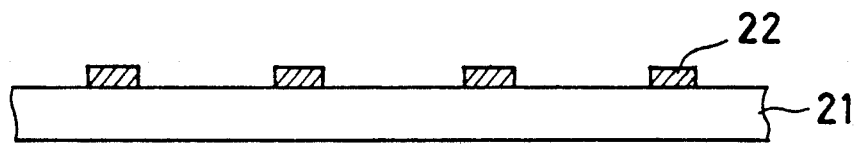
FIG. 5(a)-5(d) is a sectional view for illustrating the method for forming multi-color fluorescent planes according to the second embodiment of the present invention.

As illustrated in FIG. 5(a), a full-color pattern 22 is first formed on one side of a substrate 21.

The full-color pattern 22 may be formed on the substrate 21 by printing a paste formed of light-shielding glass, etc. on the substrate 21 by screen printing or patterning by etching to which photoprocessing is applied. Especially when reliance is placed on the latter procedure, it is possible to obtain a full-color pattern of high accuracy. It may also be possible to obtain a full-color pattern by coating a black ink on the previously masked substrate by spraying, etc. Moreover, it may be possible to form a light-shielding cell barrier on the substrate 21, thereby using the light-shielding cell barrier as the full-color pattern.

The light-shielding glass paste used to form the full-color pattern directly on the substrate 21 may be composed of low-melting glass, a black pigment, a filler and a binder.

As the black pigment, it is preferred to use a pigment based on chromium oxide-iron oxide-cobalt oxide systems of good heat resistance.

As the filler, an inorganic material possessing heat resistance such as alumina may generally be used. The binder is a resin/solvent mixture wherein cellulose derivatives such as ethyl cellulose are used as the resin and butyl carbitol acetate or terpineol (or terpinol) are generally employed alone or in combination as the solvent.

In order to form the full-color pattern by screen printing, the above light-shielding glass paste is subjected to screen printing, and is then fired to remove the binder and fix together the black pigment and filler by a melt of the low-melting glass, thereby forming the full-color pattern having the desired pattern.

According to etching to which photoprocessing is applied, the above light-shielding glass paste is coated and fired to remove the binder. Afterwards, resist patterning is carried out and the paste is partly removed by hydrofluoric acid to form the full-color pattern having the desired pattern. In order to remove the paste, the so-called sand blasting, wherein a mixture of sand with air or water is impinged on the paste for scraping-off, may be employed in place of using hydrofluoric acid.

It is understood that the material used to form the full-color pattern should not interfere with discharge since, in the blank plate shown in FIG. 5, the full-color pattern 22 remains as such in the interior of the panel.

Figure 5B:
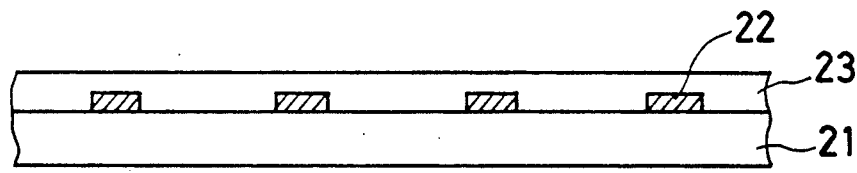
Figure 5C:
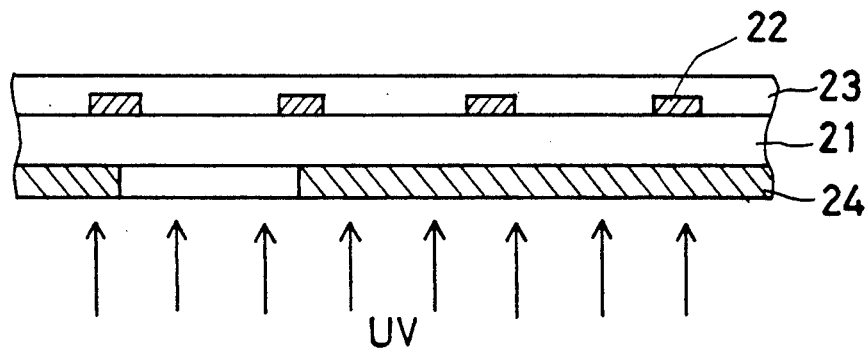
Figure 5D:
Figure 6A:
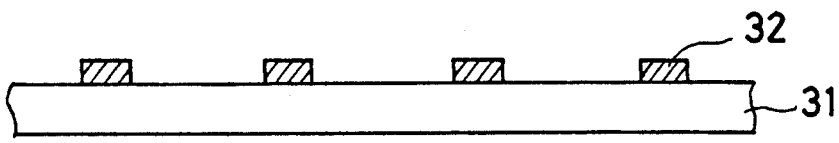
FIG. 6(a)-6(d) is a sectional view for illustrating the method for forming multi-color fluorescent planes according to the third embodiment of the present invention.
Figure 6B:
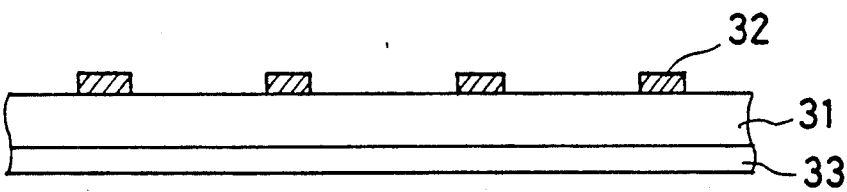
Figure 6C:
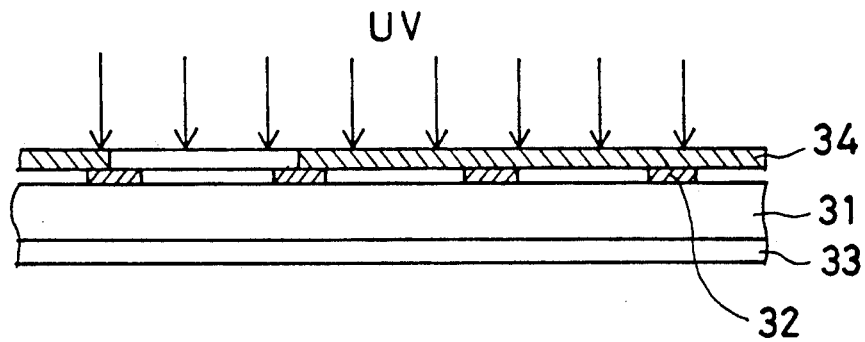
Figure 6D:
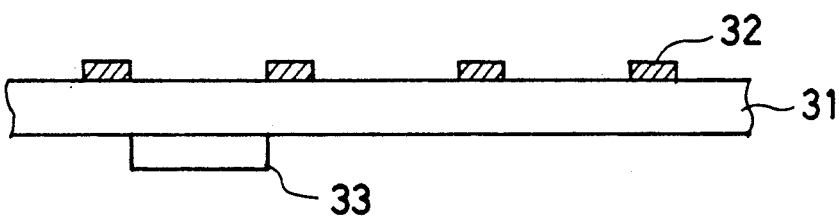

After the blank plate shown in FIG. 5(a) has been formed, a fluorophore slurry liquid 23 of the first color is coated on the full-color pattern 22, as illustrated in FIG. 5(b). Then, as shown in FIG. 5(c), a single-color mask 24 is attached to the side of the substrate 21 that is in opposition to the side on which the fluorophore slurry liquid 23 has been coated, followed by the irradiation of ultraviolet rays. After exposure to ultraviolet rays, development and drying give a fluorescent plane of the first color, as illustrated in FIG. 5(d). By repeating the above steps, it is possible to obtain a multi-color fluorescent plane having the desired pattern.

It is understood that the material of the substrate 21 and the procedures for washing, coating of the fluorophore slurry liquid, irradiation and development are similar to those mentioned in connection with the first embodiment.

Due to its light-shielding properties as mentioned above, the full-color pattern 22 formed on the substrate 21 functions as a mask for preventing the reflection of external light.

FIG. 6 shows the third embodiment which are only different from the above second embodiment in the side of the substrate on which the fluorophore slurry liquid is to be coated. More specifically, the fluorophore slurry liquid 23 is coated on the full-color pattern 22 in the second embodiment illustrated in FIGS. 5(a)-5(d). In the third embodiment illustrated in FIGS. 6(a)-6(d), however, a fluorophore slurry liquid 33 is coated on the side of a substrate 31 that is in opposition to the side having a full-color pattern 32, as illustrated in FIG. 6(b). As illustrated in FIG. 6(c), arranged on the full-color pattern 32 is a single-color mask 34, from above which the substrate is irradiated with and exposed to ultraviolet rays. Subsequent development, washing and drying give a fluorescent plane of the first color, as illustrated in FIG. 6(d). By repeating the above steps, it is possible to obtain a multi-color fluorescent plane having the desired pattern.

If the fluorescent plane is formed on the side opposite to the full-color pattern as in the embodiment illustrated in FIGS. 6(a)-6(d), the full-color pattern then places some limitation upon the angle of field of view, offering an obstacle when the panel is viewed at an angle. However, that full-color pattern may be left intact after the formation of the fluorescent plane, since it functions to prevent the reflection of external light. It is understood that if the full-color pattern is removed after the formation of the fluorescent plane, the paste may then be used without firing in the process for forming the full-color pattern. However, it is desired in view of handling that the full-color pattern be formed with a dye or pigment-containing ink, where film strength is needed.

Figure 8:
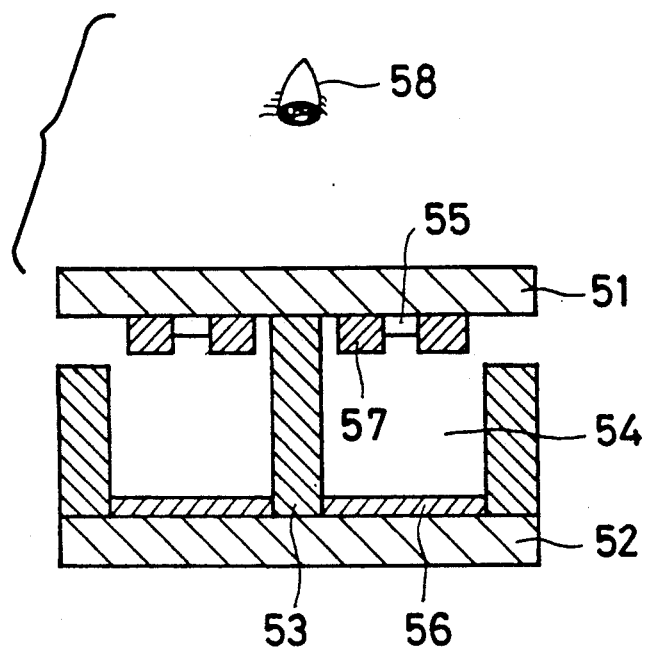
FIG. 8 is a sectional view showing one example of the structure of conventional AC type of PDPs.
Figure 9:
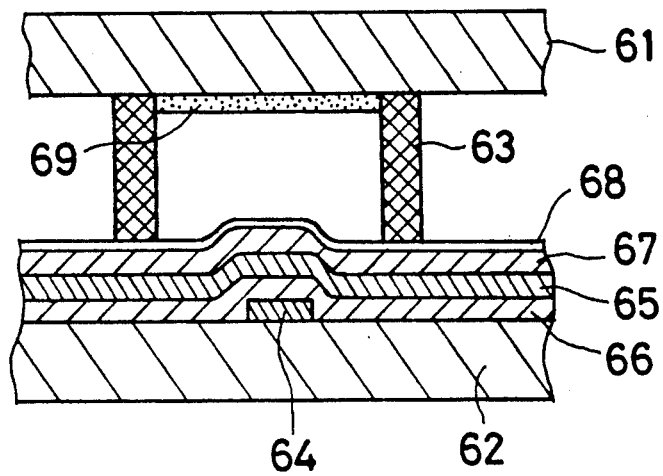
FIG. 9 is a sectional view showing one example of the structure of conventional AC type of PDPs.
Figure 10:
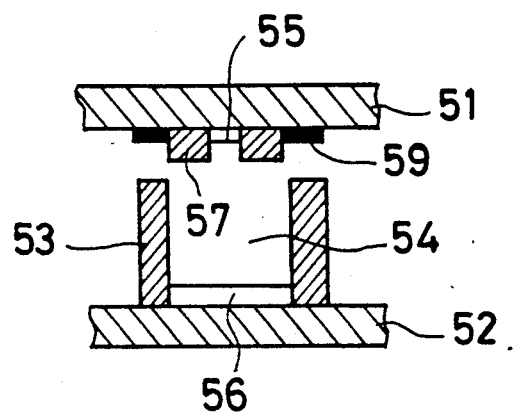
FIG. 10 is a sectional view showing another example of the structure of conventional DC type of PDPs.
Figure 11A:
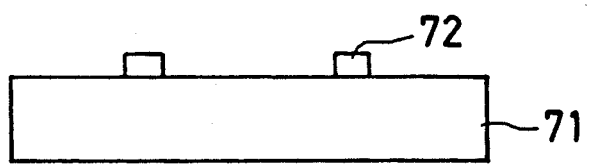
FIG. 11(a)-11(e) is a sectional view for illustrating a conventional method for forming multi-color fluorescent planes.
Figure 11B:
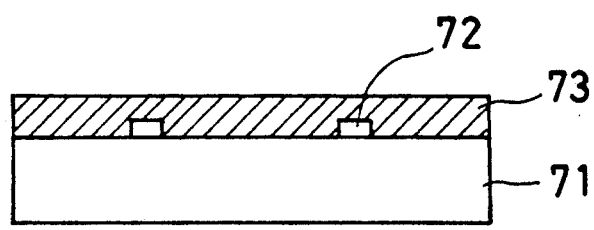
Figure 11C:
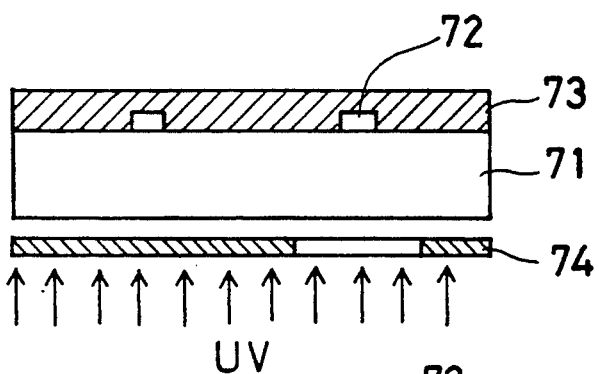
Figure 11D:
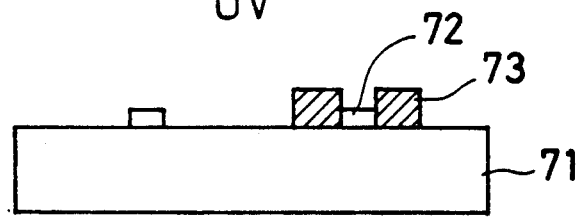
Figure 11E:
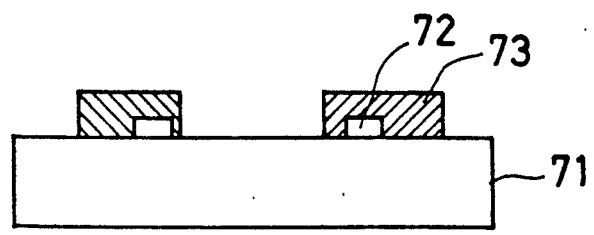

The fluorescent plane prepared through the steps shown in FIGS. 5(a)-5(d) or 6(a)-6(d) is applicable to the DC type of PDP of FIG. 8 and the AC type of PDP of FIG. 9. Again, it is applicable to systems having a cell barrier formed on the front or back plates. Still again, it is applicable to PDPs having on the front plates a mask for preventing the reflection of external light, as shown in FIG. 10.

Figure 7A:
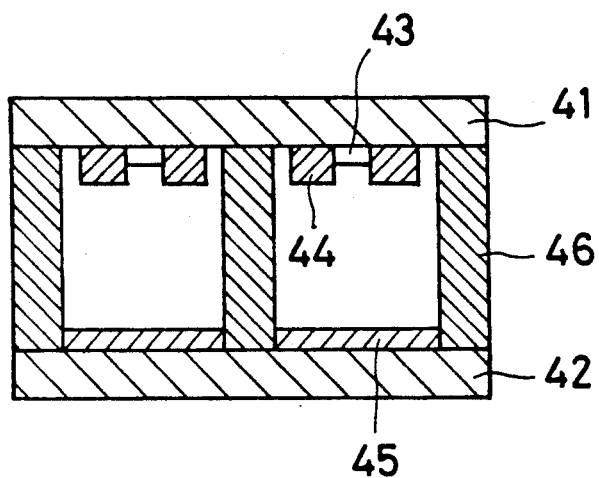
FIG. 7(a)-7(b) is a sectional view showing the structure of the DC type of PDP assembled.
Figure 7B:
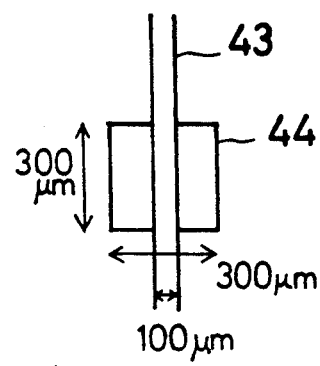

Actual examples of the above embodiments will now be given. In the following examples, prepared were the DC type of PDPs of such a structure as shown in FIGS. 7(a) and 7(b). It is noted that FIG. 7(a) is a sectional view of the PDP and FIG. 7(b) illustrates the fluorescent planes as viewed from above. The PDP had a pitch of 0.5 mm, including front and back plates 41 and 42 each of 3 mm in thickness, an anode 43 of 150 $\mu$m in width and 20 $\mu$m in thickness, a fluorescent plane 44 of 300 $\mu$m $\times$ 300 $\mu$m and 5 to 10 $\mu$m in thickness, a cathode 45 of 300 $\mu$m in width and 200 $\mu$m in thickness and a cell barrier of 150 $\mu$m in width and 200 $\mu$m in thickness. Throughout the examples, the anode 43 was formed by screen printing of an Au paste, followed by firing at 580° C., the cathode 45 by screen printing of an Ni paste, followed by firing at 580° C. and the cell barrier 46 by screen-printing a glass paste ten times, followed by firing at 580° C.

EXAMPLE 1

This is an actual example of the embodiment shown in FIGS. 1(a)-1(f).

With the use of a blade coater, a photosensitive slurry consisting of 30% by weight of a red fluorophore [(Gd, Y)BO$_3$:Eu], 4% by weight of PVA, 65.8% by weight of water and 0.2% by weight of a diazonium salt was coated on a substantially entire side of a glass substrate formed of soda float glass having a thickness of 3 mm to a thickness of 10 $\mu$m as measured after drying. After the photosensitive slurry had been dried, a full-color mask including a 0.5-mm interval matrix array of square light-transmitting segments each having a side of 350 $\mu$m in length was placed on the side of the glass substrate in opposition to the side having the photosensitive slurry coated thereon. While wrapping the peripheral edge of the glass substrate, the full-color mask was closely and fixedly provided on the opposite side. Laminated on the full-color mask was a single-color mask including square light-transmitting segments each having a side of 425 $\mu$m in positions corresponding to red. Afterwards, the coated film was vertically exposed from the side of the substrate opposite to the photosensitive slurry-coated side to light emanating from a parallel light source through the full- and single-color masks. Subsequent development with warm water of 40° C. gave a red fluorescent plane.

Subsequently, while the full-color mask remained closely and fixedly attached to the glass substrate, a photosensitive slurry containing a green fluorophore (Zn$_2$SiO$_4$:Mn) was coated and dried in the same manner as mentioned above, and a single-color mask including light-transmitting segments in positions corresponding to green was laminated on the substrate, followed by exposure to light and development, which gave a green fluorescent plane.

Likewise, a blue fluorescent plane was formed with a photosensitive slurry containing a blue fluorophore (BaMgAl$_{14}$O$_{23}$:Eu).

Finally, the full-color mask was removed.

The fluorescent plane thus formed on the glass substrate assumed a three-colored matrix array of red, green and blue. When used as a PDP, it could reproduce precise and uniform colors over the entire surface thereof.

EXAMPLE 2

This is the first example of the embodiment shown in FIGS. 5(a)-5(d).

Prior to coating of a photosensitive slurry, a black glass paste was previously screen-printed on a 3-mm thick glass substrate of soda float glass to form a full-color pattern in which square light-transmitting segments each having a side of 350 $\mu$m in length were arranged in matrix form at 0.5-mm intervals, and which was then fired at 580° C. for 30 minutes.

Then, a photosensitive slurry consisting of 30% by weight of a red fluorophore [(Gd, Y)BO$_3$:Eu], 4% by weight of PVA, 65.8% by weight of water and 0.2% by weight of a diazonium salt was coated over the substantially entire surface of the above full-color pattern to a thickness of 10 μm as measured after drying with the use of a blade coater, followed by drying.

Afterwards, a single-color mask including square light-transmitting segments each having a side of 425 μm in length in positions corresponding to red was laminated on the side of the glass substrate opposite to the side having the photosensitive slurry coated thereon. The coated film was then vertically exposed to light emanating from a parallel light source from the opposite side of the substrate through the above full- and single-color masks. Subsequent development with warm water of 40° C. gave a red fluorescent plane.

Then, a photosensitive slurry containing a green fluorophore ($Zn_2SiO_4$:Mn) in place of the red fluorophore was coated and dried in the same manner as mentioned above, and a single-color mask including light-transmitting segments in positions corresponding to green was laminated on the substrate, followed by exposure to light and development, which gave a green fluorescent plane.

Finally, a photosensitive slurry containing a blue fluorophore ($BaMgAl_{14}O_{23}$:Eu) was coated with subsequent exposure to light through a single-color mask including light-transmitting segments in positions corresponding to blue, whereby a blue fluorescent plane was formed after development.

In this manner, a three-colored fluorescent plane of red, green and blue was formed on the glass substrate. When used as a PDP, it could reproduce precise and uniform colors over the entire surface of the panel.

EXAMPLE 3

This is the second example of the embodiment shown in FIGS. 5(a)-5(d).

Five stacks of a black glass paste were screen-printed on a 3-mm thick glass substrate of soda float glass in a matrix-form pattern at line widths of 150 μm and intervals of 0.5 mm, and were then fired to form a cell barrier of 100 μm in height.

Subsequently, the photosensitive slurry used in Example 2 was spray-coated on the surface of the formed cell barrier to a thickness of 10 μm as measured after drying, followed by drying.

Afterwards, exposure to light and development were repeated in a similar manner as described in Example 2, provided that the cell barrier itself was used as a full-color mask, thereby obtaining a three-colored fluorescent plane.

When the fluorescent plane thus formed on the glass substrate was used as a PDP, it could reproduce precise and uniform colors over the entire surface of the panel.

EXAMPLE 4

This is an example of the embodiment shown in FIGS. 6(a)-6(d).

On the side of a 3-mm thick glass substrate of soda float glass in opposition to the side having a photosensitive slurry coated thereon was screen-printed a black glass paste to form a full-color pattern including a 0.5-mm interval matrix array of square light-transmitting segments each having a side of 350 μm in length, which was then dried at 150° C.

With the use of a blade coater, a photosensitive slurry consisting of 30% by weight of a red fluorophore [(Gd, Y) $BO_3$: Eu], 4% by weight of PVA and 66% by weight of water was coated and dried on the substantially entire surface of the side of the glass substrate opposite to the side having the full-color pattern printed thereon to a thickness of 10 μm as measured after drying.

Afterwards, laminated on the full-color pattern was a single-color mask including square light-transmitting segments each having a side of 425 μm in length in positions corresponding to red. The coated film was then vertically exposed to light emanating from a parallel light source from the side of the substrate opposite to the photosensitive slurry-coated side through the full-color pattern and the single-color mask. Subsequent development with warm water of 40° C. gave a red fluorescent plane.

Subsequently, a photosensitive slurry using $Zn_2SiO_4$:Mn as a red fluorophore was coated and dried in the same manner as mentioned above, and a single-color mask including light-transmitting segments in positions corresponding to blue was laminated on the substrate in place of the above single-color mask for exposure to light and development, thereby forming a green fluorescent plane.

Likewise, a blue fluorescent plane was formed by using $BaMgAl_{14}O_{23}$:Mn as a blue fluorophore and a single-color mask including light-transmitting segments in positions corresponding to blue.

After that, the full-color pattern printed on the glass substrate was removed with a ketone-base solvent.

The fluorescent plane formed on the glass substrate in this manner corresponded to a three-colored matrix array of red, green and blue. When used a PDP, it could reproduce precise and uniform colors over the entire surface of the panel.

As will be appreciated from the foregoing explanation, the position alignment of photomasks can be very easily and precisely achieved since, according to the present invention, the position for exposure to light can be determined by a combination of the full-color mask with the single-color mask. It is thus possible to form multi-color fluorescent planes for full-color PDPs, etc. with high accuracy and facility.

It is also possible to form, with high productivity, multi-color fluorescent planes excelling in color uniformity over the entire surfaces of the panels.

What is claimed is:

1. A method for forming multi-color fluorescent planes comprising the steps of:
   repeating the steps of coating a fluorophore-containing photosensitive layer on one side of a transparent substrate and, thereafter, exposing said photosensitive layer to light from the other side of said transparent substrate, followed by developing, wherein
   said photosensitive layer is exposed to light with a combination of a full-color mask including light-transmitting segments to coincidence with every color pattern and a single-color mask including light-transmitting segments corresponding to each color pattern.

2. A method as claimed in claim 1, further comprising the steps of:
   forming said full-color pattern, including light-transmitting segments in coincidence with every color pattern, on the side of said transparent substrate in opposition to the side having said photosensitive layer formed thereon,
   arranging said single-color mask, including light-transmitting segments corresponding to each color pattern, on said full-color pattern, and aligning said light-transmitting segments of said full-color pattern with said light-transmitting segments of said single-color mask, wherein the steps of exposure to light and developing are carried out for each photosensitive layer of each color.

3. A method as claimed in claim 1 or 2, wherein:
said light-transmitting segments of said single-color mask are larger in size than said light-transmitting segments of said full-color pattern.

4. A method as claimed in any one of claims 1-3, wherein:
said photosensitive layer is formed of a photosensitive slurry containing a fluorophore.

5. A method as claimed in any one of claims 1-3, wherein:
said photosensitive layer is formed by coating of a photosensitive tackifier and subsequent deposition of a powdery fluorophore.

6. A method for forming multi-color fluorescent planes, comprising the steps of:
previously forming a full-color pattern including light-transmitting segments in coincidence with every color pattern, on a transparent substrate,
forming a photosensitive layer on said full-color pattern, and
arranging a single-color mask light-transmitting segments corresponding to each color pattern on the side of said transparent substrate in opposition to the side having said photosensitive layer formed thereon, while aligning said light-transmitting segments of said full-color pattern with said light-transmitting segments of said single-color mask, wherein the steps of exposure to light and development are carried out for each photosensitive layer of each color.

7. A method as claimed in claim 6, wherein:
said light-transmitting segments of said single-color mask are larger in size than said light-transmitting segments of said full-color pattern.

8. A method as claimed in claim 6 or 7, wherein:
said photosensitive layer is formed of a photosensitive slurry containing a fluorophore.

9. A method as claimed in claim 6 or 7, wherein:
said photosensitive layer is formed by coating of a photosensitive tackifier and subsequent deposition of a powdery fluorophore.

10. A blank plate for forming multi-color fluorescent planes, comprising:
a transparent substrate; and
a full-color mask having a full-color pattern including light-transmitting segments in coincidence with every color pattern, a shape, size and arrangement of said light-transmitting segments define every color pattern formed on multi-color fluorescent planes, said full-color mask removably mounted on said transparent substrate.

11. A blank plate for forming multi-color fluorescent planes, comprising:
a transparent substrate; and
a full-color pattern, including light-transmitting segments in coincidence with every color pattern, formed on one side of said transparent substrate, a shape, size and arrangement of every color pattern formed on multi-color fluorescent planes defined by said light-transmitting segments.

* * * * *